United States Patent
Hatakeyama et al.

(10) Patent No.: US 9,467,142 B2
(45) Date of Patent: *Oct. 11, 2016

(54) SEMICONDUCTOR DEVICE WITH BUFFER AND REPLICA CIRCUITS

(71) Applicant: PS4 LUXCO S.A.R.L., Luxembourg (LU)

(72) Inventors: Toru Hatakeyama, Tokyo (JP); Toru Ishikawa, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/662,962

(22) Filed: Mar. 19, 2015

(65) Prior Publication Data

US 2015/0194957 A1  Jul. 9, 2015

Related U.S. Application Data

(63) Continuation of application No. 14/018,784, filed on Sep. 5, 2013, now Pat. No. 8,994,401, which is a continuation of application No. 12/969,030, filed on Dec. 15, 2010, now Pat. No. 8,547,138.

(30) Foreign Application Priority Data

Dec. 17, 2009  (JP) .................... 2009-286383

(51) Int. Cl.
| | |
|---|---|
| *H03K 19/0175* | (2006.01) |
| *H03K 19/00* | (2006.01) |
| *G11C 5/06* | (2006.01) |
| *G11C 7/10* | (2006.01) |

(52) U.S. Cl.
CPC ............ *H03K 19/0027* (2013.01); *G11C 5/06* (2013.01); *G11C 7/1087* (2013.01)

(58) Field of Classification Search
CPC .................. H03K 19/0027; H03K 19/00384; H03K 19/018585; H03K 19/01721; H03K 19/018521; H03K 3/3565; H03K 5/084
See application file for complete search history.

(56) References Cited

U.S. PATENT DOCUMENTS

| | | | | |
|---|---|---|---|---|
| 6,144,223 | A  * | 11/2000 | Momtaz ............. | G06F 13/4072 326/27 |
| 2005/0156624 | A1* | 7/2005 | Sommer .......... | H03K 19/00384 326/33 |
| 2005/0231268 | A1* | 10/2005 | Kim ...................... | H01L 27/092 327/538 |
| 2006/0181303 | A1* | 8/2006 | Dreps ................. | G06F 13/4072 326/29 |

* cited by examiner

*Primary Examiner* — Jany Richardson
(74) *Attorney, Agent, or Firm* — Kunzler Law Group, PC (57) ABSTRACT

A semiconductor device, includes an input buffer, first and second PMOS transistors serially interconnected between a first power supply node and an output node of the input buffer. First and second NMOS transistors are serially interconnected between a second power supply node and the output node of the input buffer. A replica circuit includes a third and fourth PMOS transistors serially interconnected between the first power supply node and an output node of the replica circuit. Third and fourth NMOS transistors are serially interconnected between the second power supply node and the output node of the replica circuit. The input node of the replica circuit is connected to the output node of the replica circuit and a comparison circuit compares a voltage at the output node of the replica circuit to a reference voltage.

13 Claims, 7 Drawing Sheets

SEMICONDUCTOR DEVICE WITH BUFFER AND REPLICA CIRCUITS

RELATED APPLICATIONS

This Application is a Continuation Application of U.S. patent application Ser. No. 14/018,784, filed on Sep. 5, 2013, which is a Continuation Application of U.S. patent application Ser. No. 12/969,030 (Now U.S. Pat. No. 8,547,138 B2).

BACKGROUND OF THE INVENTION

1. Field of the Invention

The present invention relates to a semiconductor device having an input circuit in which a change of a logic threshold voltage is suppressed.

Priority is claimed on Japanese Patent Application No. 2009-286383, filed Dec. 17, 2009, the content of which is incorporated herein by reference.

2. Description of the Related Art

In semiconductor devices such as a central processing unit (CPU) and a dynamic random access memory (DRAM), an amplitude of an input signal input from the outside becomes low due to a decrease in an operating power supply voltage. That is, if a high potential side of the amplitude of the input signal is set to VIH and a low potential side thereof is set to VIL, a difference (VIH-VIL) is small. An input circuit (input buffer) to which the input signal is input has a logic threshold voltage. If VIH is higher than the logic threshold voltage, the input signal is sensed as an H level (logic "1" level). If VIL is lower than the logic threshold voltage, the input signal is sensed as an L level (logic "0" level).

Thus, the logic threshold voltage of the input circuit is designed to be set to a specified value substantially intermediate between VIH and VIL, but VIH/VIL of the input signal may not be accurately sensed if the logic threshold voltage is shifted from the specified value by a process variation, a temperature change, or the like when (VIH-VIL) decreases.

To solve this problem, a technique has been disclosed to adjust a logic threshold voltage in correspondence with a level of an input signal using a ring oscillator in a semiconductor device disclosed in Japanese Unexamined Patent Application, First Publication, No. 6-85652.

SUMMARY

In one embodiment, a semiconductor device may include, but is not limited to, a first input buffer, a first replica circuit, a first reference voltage generating circuit, and a first comparator circuit. The first input buffer adjusts a logic threshold voltage. The first replica circuit is identical in circuit configuration to the first input buffer. The first replica circuit has an input and an output. The output is connected to the input. The first replica circuit generates the logic threshold voltage as an output voltage. The first reference voltage generating circuit generates a first reference voltage. The first comparator circuit compares the logic threshold voltage as an output voltage of the first replica circuit to the first reference voltage to generate a first threshold adjustment signal. The first comparator circuit supplies the first threshold adjustment signal to the first input buffer and the first replica circuit. The first threshold adjustment signal allows the first input buffer to adjust the logic threshold voltage.

In another embodiment, a semiconductor device may include, but is not limited to, a first input buffer, and a first adjustment signal generating circuit. The first input buffer adjusts a logic threshold voltage. The first adjustment signal generating circuit coupled to the first input buffer. The first adjustment signal generating circuit may include, but is not limited to, a first replica circuit, a first reference voltage generating circuit, and a first comparator circuit. The first replica circuit is identical in circuit configuration to the first input buffer. The first replica circuit has an input and an output. The output is connected to the input. The first replica circuit generates the logic threshold voltage as an output voltage. The first reference voltage generating circuit generates a first reference voltage. The first comparator circuit compares the logic threshold voltage as an output voltage of the first replica circuit to the first reference voltage to generate a first threshold adjustment signal. The first comparator circuit supplies the first threshold adjustment signal to the first input buffer and the first replica circuit. The first threshold adjustment signal allows the first input buffer to adjust the logic threshold voltage.

In still another embodiment, a semiconductor device may include, but is not limited to, a first input buffer, a first replica circuit, a first reference voltage generating circuit, and a first comparator circuit. The first input buffer adjusts a logic threshold voltage. The first replica circuit is identical in circuit configuration to the first input buffer. The first replica circuit has an input and an output. The output is connected to the input. The first replica circuit generates the logic threshold voltage as an output voltage. The first reference voltage generating circuit generates a first reference voltage. The first comparator circuit compares the logic threshold voltage as an output voltage of the first replica circuit to the first reference voltage to generate a first threshold adjustment signal. The first comparator circuit supplies the first threshold adjustment signal to the first input buffer and the first replica circuit. The first threshold adjustment signal allows the first input buffer to adjust the logic threshold voltage. The first input buffer may include, but is not limited to, a logic inverter circuit, and a first logic threshold voltage control transistor. The logic inverter circuit receives an input signal. The first logic threshold voltage control transistor is coupled to the logic inverter circuit. The first logic threshold voltage control transistor is controlled in conduction by the first threshold adjustment signal. The logic inverter circuit and the first logic threshold voltage control transistor are coupled between a power voltage line and a fixed voltage line. The first replica circuit may include, but is not limited to, a first sub-replica circuit and a second logic threshold voltage control transistor. The first sub-replica circuit is identical in circuit configuration to the logic inverter circuit. The first sub-replica circuit has an input and an output coupled to the input. The second logic threshold voltage control transistor is coupled to the first sub-replica circuit. The second logic threshold voltage control transistor is controlled in conduction by the first threshold adjustment signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail, in order to facilitate the understanding of the present invention. A logic threshold voltage is adjusted using a measurement result of an oscillator in the semiconductor device disclosed in the above-described Japanese Unexamined Patent Application, First Publication, No. 6-85652. Thus, it is difficult to obtain an accurate logic threshold voltage without necessarily reflecting a characteristic change actually occurring in an input circuit, for example, a characteristic change made by a process variation of a transistor constituting the input circuit.

Also, there is a problem in that the semiconductor device of the above-described Japanese Unexamined Patent Application, First Publication, No. 6-85652 may not be used in a semiconductor device in which a frequency of an external clock (CLK) is changed in response to a use situation since an adjustment process is performed by comparing a frequency of an oscillator with a frequency of a clock (external CLK) input from the outside.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a first input buffer, a first replica circuit, a first reference voltage generating circuit, and a first comparator circuit. The first input buffer adjusts a logic threshold voltage. The first replica circuit is identical in circuit configuration to the first input buffer. The first replica circuit has an input and an output. The output is connected to the input. The first replica circuit generates the logic threshold voltage as an output voltage. The first reference voltage generating circuit generates a first reference voltage. The first comparator circuit compares the logic threshold voltage as an output voltage of the first replica circuit to the first reference voltage to generate a first threshold adjustment signal. The first comparator circuit supplies the first threshold adjustment signal to the first input buffer and the first replica circuit. The first threshold adjustment signal allows the first input buffer to adjust the logic threshold voltage.

In some cases, the first input buffer may include, but is not limited to, a logic inverter circuit that receives an input signal, and a first logic threshold voltage control transistor coupled to the logic inverter circuit. The first logic threshold voltage control transistor is controlled in conduction by the first threshold adjustment signal.

In some cases, the logic inverter circuit and the first logic threshold voltage control transistor are coupled between a power voltage line and a fixed voltage line.

In some cases, the first replica circuit may include, but is not limited to, a first sub-replica circuit, and a second logic threshold voltage control transistor. The first sub-replica circuit is identical in circuit configuration to the logic inverter circuit. The first sub-replica circuit has an input and an output coupled to the input. The second logic threshold voltage control transistor is coupled to the first sub-replica circuit. The second logic threshold voltage control transistor is controlled in conduction by the first threshold adjustment signal.

In some cases, the first input buffer has a first circuit constant. The first replica circuit has a second circuit constant. The second circuit constant is equal to or larger by a natural number of times than the first circuit constant.

In some cases, the first sub-replica circuit and the second logic threshold voltage control transistor are coupled between the power voltage line and the fixed voltage line.

In some cases, the first comparator circuit supplies the first threshold adjustment signal to gates of the first and second logic threshold voltage control transistors.

In some cases, the semiconductor device may include, but is not limited to, a third logic threshold voltage control transistor, and a fourth logic threshold voltage control transistor. The third logic threshold voltage control transistor is coupled to a first current path of the first input buffer in parallel to the first logic threshold voltage control transistor. The fourth logic threshold voltage control transistor is coupled to a second current path of the first replica circuit in parallel to the second logic threshold voltage control transistor. Each of the first, second, third and fourth logic threshold voltage control transistors is controlled in conduction by a selecting signal.

In some cases, the semiconductor device may include, but is not limited to, an up-down counter, and a selecting signal generator. The up-down counter compares the logic threshold voltage to the first reference voltage to count up or count down a count value based on a result of comparison by the first comparator circuit. The selecting signal generator generates the selecting signal based on the count value. The selecting signal generator holds a logic level of the selecting signal.

In some cases, the up-down counter performs up-down counting operation in a time period of operational mode. After the time period of operational mode, each of the first, second, third and fourth logic threshold voltage control transistors is controlled in conduction by the selecting signal.

In some cases, the semiconductor device may include, but is not limited to, a first current control transistor, and a second current control transistor. The first current control transistor is coupled in series to the first replica circuit. The first current control transistor is provided on the second current path of the first replica circuit. The second current control transistor is coupled between a power voltage line and a fixed voltage line of the first reference voltage generating circuit. The first and second control transistors are controlled in condition by a control signal that represents that it is in the time period of operational mode.

In some cases, the semiconductor device may include, but is not limited to, a second input buffer, a second replica circuit, a second first reference voltage generating circuit, and a second comparator circuit. The second input buffer is identical in circuit configuration to the first input buffer. The first and second input buffers commonly receive the logic threshold voltage. The second replica circuit is identical in circuit configuration to the first and second input buffers. The second replica circuit has an input and an output. The output is connected to the input. The second replica circuit generates the logic threshold voltage as an output voltage. The second first reference voltage generates circuit that generates a second reference voltage. The second comparator circuit compares the logic threshold voltage as an output voltage of the second replica circuit to the second reference voltage to generate a second threshold adjustment signal. The second comparator circuit supplies the second threshold adjustment signal to the second input buffer and the second replica circuit.

In some cases, the semiconductor device may include, but is not limited to, a third current control transistor, a fourth current control transistor, a fifth current control transistor, a sixth current control transistor, a sixth current control transistor, and an eighth current control transistor. The third current control transistor is coupled to the first replica circuit between a power voltage line and a fixed voltage line. The third current control transistor is controlled in conduction by a control signal that represents that it is in the time period of operational mode. The fourth current control transistor is coupled to the first reference voltage generating circuit between the power voltage line and the fixed voltage line. The fourth current control transistor is controlled in conduction by the control signal. The fifth current control transistor is coupled to the first comparator circuit between the power voltage line and the fixed voltage line. The fifth current control transistor is controlled in conduction by the control signal. The sixth current control transistor is coupled to the second replica circuit between the power voltage line and the fixed voltage line. The sixth current control transistor is controlled in conduction by an inverted control signal of the control signal. The seventh current control transistor is coupled to the second reference voltage generating circuit between the power voltage line and the fixed voltage line. The seventh current control transistor is controlled in conduction by the inverted control signal. The eighth current control transistor is coupled to the second comparator circuit between the power voltage line and the fixed voltage line. The eighth current control transistor is controlled in conduction by the inverted control signal.

In some cases, the first replica circuit, the first reference voltage generating circuit, the first comparator circuit, the third current control transistor, the fourth current control transistor, and the fifth current control transistor perform as a first adjustment signal generating circuit. The first adjustment signal generating circuit generates the threshold adjustment signal. The first adjustment signal generating circuit performs operation in the time period of operation mode. The second replica circuit, the second reference voltage generating circuit, the second comparator circuit, the sixth current control transistor, the seventh current control transistor, and the eighth current control transistor perform as a second adjustment signal generating circuit. The second adjustment signal generating circuit generates the threshold adjustment signal. The second adjustment signal generating circuit performs operation in a time period of stand-by mode.

In some cases, the second adjustment signal generating circuit is proportionally reduced in circuit constants to the first adjustment signal generating circuit.

In some cases, the first reference voltage generating circuit may include, but is not limited to, a series connection of first and second resistances and at least one programmable resistive element. The series connection is coupled between a power voltage line and a fixed voltage line. The at least one programmable resistive element is coupled between an output of the first reference voltage generating circuit and one of the power voltage line and the fixed voltage line.

In another embodiment, a semiconductor device may include, but is not limited to, a first input buffer, and a first adjustment signal generating circuit. The first input buffer adjusts a logic threshold voltage. The first adjustment signal generating circuit coupled to the first input buffer. The first adjustment signal generating circuit may include, but is not limited to, a first replica circuit, a first reference voltage generating circuit, and a first comparator circuit. The first replica circuit is identical in circuit configuration to the first input buffer. The first replica circuit has an input and an output. The output is connected to the input. The first replica circuit generates the logic threshold voltage as an output voltage. The first reference voltage generating circuit generates a first reference voltage. The first comparator circuit compares the logic threshold voltage as an output voltage of the first replica circuit to the first reference voltage to generate a first threshold adjustment signal. The first comparator circuit supplies the first threshold adjustment signal to the first input buffer and the first replica circuit. The first threshold adjustment signal allows the first input buffer to adjust the logic threshold voltage.

In some cases, the semiconductor device may include, but is not limited to, a second input buffer, and a second adjustment signal generating circuit. The second input buffer adjusts the logic threshold voltage. The second adjustment signal generating circuit is coupled to the second input buffer. The second adjustment signal generating circuit is proportionally reduced in circuit constants to the first adjustment signal generating circuit. The second adjustment signal may include, but is not limited to, a second replica circuit, a second reference voltage generating circuit, and a second comparator circuit. The second replica circuit is identical in circuit configuration to the second input buffer. The second replica circuit has an input and an output. The output is connected to the input. The second replica circuit generates the logic threshold voltage as an output voltage. The second reference voltage generating circuit generates a second reference voltage. The second comparator circuit compares the logic threshold voltage as an output voltage of the second replica circuit to the second reference voltage to generate a second threshold adjustment signal. The second comparator circuit supplies the second threshold adjustment signal to the second input buffer and the second replica circuit. The second threshold adjustment signal allows the first and second input buffers to adjust the logic threshold voltage. The first adjustment signal generating circuit performs operation in a time period of operation mode. The second adjustment signal generating circuit performs operation in a time period of stand-by mode.

In some cases, the semiconductor device may include, but is not limited to, a first current control transistor, and a second current control transistor. The first current control transistor is coupled in series to the first replica circuit. The first current control transistor is provided on the second current path of the first replica circuit. The second current control transistor is coupled between a power voltage line and a fixed voltage line of the first reference voltage generating circuit. The first and second control transistors are controlled in condition by a control signal that represents that it is in the time period of operational mode.

In still another embodiment, a semiconductor device may include, but is not limited to, a first input buffer, a first replica circuit, a first reference voltage generating circuit, and a first comparator circuit. The first input buffer adjusts a logic threshold voltage. The first replica circuit is identical in circuit configuration to the first input buffer. The first replica circuit has an input and an output. The output is connected to the input. The first replica circuit generates the logic threshold voltage as an output voltage. The first reference voltage generating circuit generates a first reference voltage. The first comparator circuit compares the logic threshold voltage as an output voltage of the first replica circuit to the first reference voltage to generate a first threshold adjustment signal. The first comparator circuit supplies the first threshold adjustment signal to the first input buffer and the first replica circuit. The first threshold adjustment signal allows the first input buffer to adjust the logic threshold voltage. The first input buffer may include, but is not limited to, a logic inverter circuit, and a first logic threshold voltage control transistor. The logic inverter circuit receives an input signal. The first logic threshold voltage control transistor is coupled to the logic inverter circuit. The first logic threshold voltage control transistor is controlled in conduction by the first threshold adjustment signal. The logic inverter circuit and the first logic threshold voltage control transistor are coupled between a power voltage line and a fixed voltage line. The first replica circuit may include, but is not limited to, a first sub-replica circuit and a second logic threshold voltage control transistor. The first sub-replica circuit is identical in circuit configuration to the logic inverter circuit. The first sub-replica circuit has an input and an output coupled to the input. The second logic threshold voltage control transistor is coupled to the first sub-replica circuit. The second logic threshold voltage control transistor is controlled in conduction by the first threshold adjustment signal.

An input buffer includes a CMOS circuit formed by a P-channel type MOS transistor and an N-channel type MOS transistor which are connected in series between a power supply potential and a ground potential and have gate terminals commonly connected to an input terminal. The CMOS circuit outputs a power supply potential VDD when an input signal has an L level, and outputs a ground potential VSS when the input signal has an H level. When the H or L level of the input signal level is sensed, a reference value is a logic threshold voltage. The CMOS circuit senses the H level when the level of the input signal is higher than the logic threshold voltage, and senses the L level when the level of the input signal is lower than the logic threshold voltage.

The logic threshold voltage is decided by a power supply potential, a threshold voltage (hereinafter, referred to as Vtp) of the P-channel type MOS transistor constituting the CMOS circuit, a threshold voltage (hereinafter, referred to as Vtn) of the N-channel type MOS transistor, circuit constants (a channel length Lp and a channel width Wp) of the P-channel type MOS transistor, a carrier mobility μp in a channel region of the P-channel type MOS transistor, circuit constants (a channel length Ln and a channel width Wn) of the N-channel type MOS transistor, and a carrier mobility μn in a channel region of the N-channel type MOS transistor.

On the other hand, in a manufacturing process, a control operation of the semiconductor device is difficult to perform such that the N-channel type MOS transistor and the P-channel type MOS transistor are affected by the same variation, that is, such that characteristics are changed in a direction in which driving abilities of the transistors are all raised or lowered. That is, Vtn and Vtp are varied independently of each other, Vtn and Vtp values are changed, and temperature dependences thereof are also different. Also, μp and μn have different values and different temperature-dependent values.

That is, the logic threshold voltage of the CMOS circuit constituting the input buffer has power supply potential dependence and temperature dependence, and is also affected by a process variation.

In a semiconductor device according to the present embodiment, an input buffer is configured in which a transistor whose conduction is controlled on the basis of a threshold adjustment signal and a transistor to which an input signal is input are provided in series between a power supply potential and a ground potential to adjust a logic threshold voltage of the input buffer. A replica in which an input and an output are connected is provided to have the same circuit configuration as the input buffer (of course, the threshold adjustment signal is also input and the conduction is controlled by the threshold adjustment signal since the circuit configuration is identical). Since the input and the output are connected in the replica, potentials of the input and the output become a logic threshold voltage of the replica itself.

A reference potential generation circuit which generates a predetermined reference potential and a comparison circuit which outputs the threshold adjustment signal by comparing an output of the replica with a reference potential are provided. Since the conduction of the replica is controlled by the threshold adjustment signal, the logic threshold voltage of the replica is the same as the reference potential. Accordingly, since it is also possible to set the logic threshold voltage of the input buffer to be same as the reference potential, a semiconductor device capable of accurately sensing a level of an input signal can be provided without being affected by a process variation.

Preferred embodiments of the present invention will now be described in detail with reference to the accompanying drawings.

First Embodiment

Figure 1:
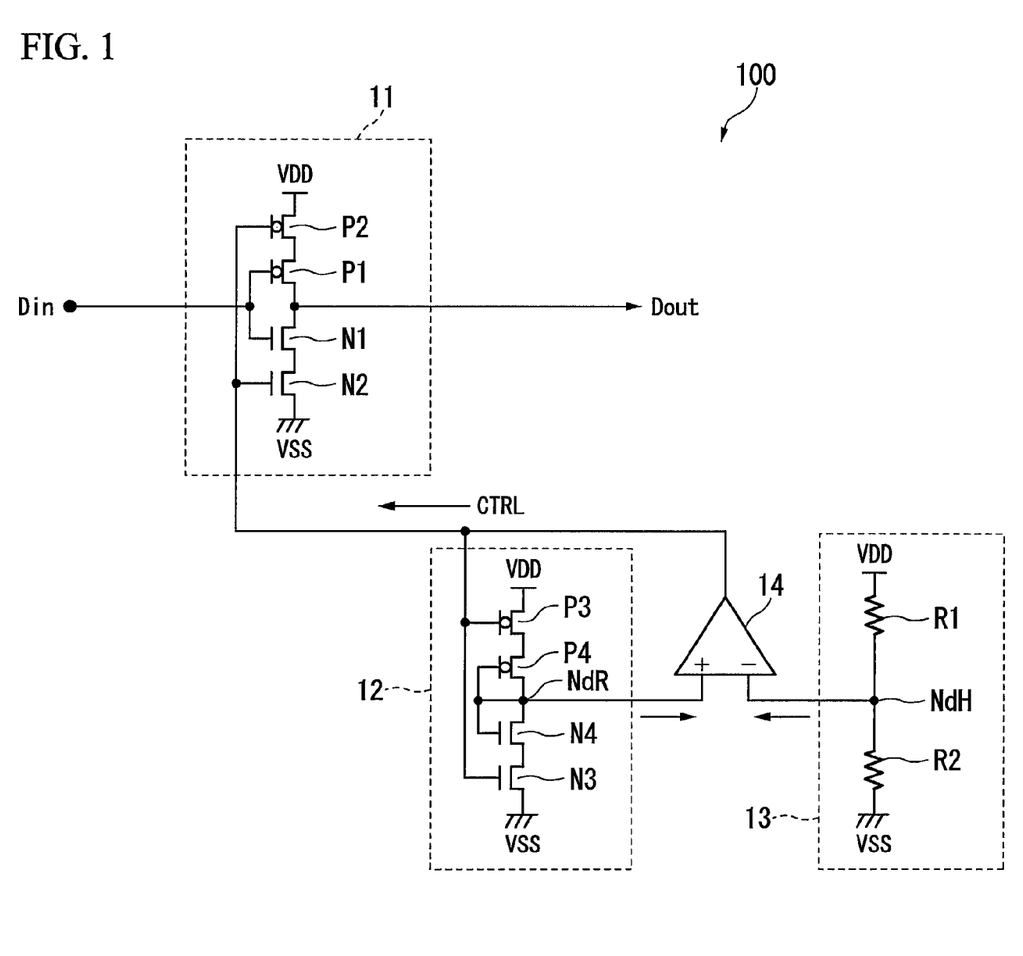
FIG. 1 is a circuit diagram illustrating a circuit configuration of a semiconductor device in accordance with a first embodiment of the present invention.

FIG. 1 is a circuit configuration diagram of a semiconductor device 100 according to an embodiment of the present invention. In FIG. 1, the semiconductor device 100 has an input CMOS circuit 11 (input buffer), a replica 12 (replica), a reference potential generation circuit 13, and a comparison circuit 14. The semiconductor device 100 has an input terminal Din to be used to exchange a signal between the semiconductor device and the outside, and outputs an inverted logic signal of an input signal to an output terminal Dout.

The input CMOS circuit 11 is, for example, an address input circuit, and is a circuit which receives an external address signal via the input terminal Din and outputs an inverted logic signal thereof. The input CMOS circuit 11 includes P-channel type MOS transistors P1 and P2 and N-channel type MOS transistors N1 and N2 connected in series between a power supply potential VDD and a ground potential VSS which form a current path.

A source terminal of the P-channel type MOS transistor P2 is connected to a power supply line through which the power supply potential VDD is supplied, a drain terminal thereof is connected to a source terminal of the P-channel type MOS transistor P1, and a gate terminal thereof is connected to the comparison circuit 14 to be described later. The source terminal of the P-channel type MOS transistor P1 is connected to the drain terminal of the P-channel type MOS transistor P2, a drain terminal thereof is connected to the output terminal Dout, and a gate terminal thereof is connected to the input terminal Din.

A drain terminal of the N-channel type MOS transistor N1 is connected to the output terminal Dout, a source terminal thereof is connected to a drain terminal of the N-channel type MOS transistor N2, and a gate terminal thereof is connected to the input terminal Din. A drain terminal of the N-channel type MOS transistor N2 is connected to the source terminal of the N-channel type MOS transistor N1, a source terminal thereof is connected to a ground line through which the ground potential VSS is supplied, and a gate terminal thereof is connected to an output terminal of the comparison circuit 14 to be described later.

The logic threshold voltage of the input CMOS circuit 11 is determined by the driving ability of each transistor, but an output of the comparison circuit 14 is variably controlled by gate potentials of the P-channel type MOS transistor P2 and the N-channel type MOS transistor N2 having the gate terminals connected thereto.

The replica 12 includes P-channel type MOS transistors P3 and P4 and N-channel type MOS transistors N3 and N4 connected in series between a power supply potential VDD and a ground potential VSS which form a current path. The replica 12 has the same circuit configuration as the input CMOS circuit 11, except that the input and the output are connected.

That is, a source terminal of the P-channel type MOS transistor P3 is connected to a power supply line through which the power supply potential VDD is supplied, a drain terminal thereof is connected to a source terminal of the P-channel type MOS transistor P4, and a gate terminal thereof is connected to the comparison circuit 14 to be described later. The source terminal of the P-channel type MOS transistor P4 is connected to a drain terminal of the P-channel type MOS transistor P3, and drain and gate terminals thereof are connected to a node NdR.

Drain and gate terminals of the N-channel type MOS transistor N4 are connected to the node NdR, and a source terminal thereof is connected to a drain terminal of the N-channel type MOS transistor N3. The drain terminal of the N-channel type MOS transistor N3 is connected to the source terminal of the N-channel type MOS transistor N4, a source terminal thereof is connected to a ground line through which the ground potential VSS is supplied, and a gate terminal thereof is connected to the output terminal of the comparison circuit 14 to be described later.

In the input CMOS circuit 11 and the replica 12, the P-channel type MOS transistor P3 corresponds to the P-channel type MOS transistor P2, the P-channel type MOS transistor P4 corresponds to the P-channel type MOS transistor P1, the N-channel type MOS transistor N4 corresponds to the N-channel type MOS transistor N1, and the N-channel type MOS transistor N3 corresponds to the N-channel type MOS transistor N2.

In this embodiment, the P-channel type MOS transistor P3 and the P-channel type MOS transistor P2 have the same constants in the channel length L and the channel width W, and the P-channel type MOS transistor P4 and the P-channel type MOS transistor P1 have the same constants in the channel length L and the channel width W. Also, the N-channel type MOS transistor N4 and the N-channel type MOS transistor N1 have the same constants in the channel length L and the channel width W, and the N-channel type MOS transistor N3 and the N-channel type MOS transistor N2 have the same constants in the channel length L and the channel width W.

As described above, the replica 12 has the same circuit configuration and the same transistor constants as the input CMOS circuit 11, except that the input and the output are connected. Moreover, a layout is designed such that drawing data for reticle fabrication to be used in a process of manufacturing the semiconductor device 100 is identical and the same layout configuration is provided when the layout is designed.

Here, since the input and the output are connected (short-circuited) in the replica 12, that is, the input potential is constantly the same as the output potential, a potential of the node NdR is the logic threshold voltage of the replica 12 itself. Accordingly, the logic threshold voltage of the input CMOS circuit 11 having the same circuit configuration and the same transistor constants as the replica 12 may be the same as that of the replica 12 under the same power supply potential, except that the input and the output are connected.

An example in which the input CMOS circuit 11 has the same transistor constants as the replica 12 has been described above, but the same constants may not necessarily be provided so as to set the same logic threshold voltage in the two circuits. It is preferable that the transistors corresponding to the two circuits have the same driving ability ratio. For example, the channel width of each transistor constituting the replica 12 may be a fixed ratio, for example, 0.5 times the channel width of each transistor constituting the input CMOS circuit 11 corresponding thereto.

The reference potential generation circuit 13 is a voltage dividing circuit including a resistance element R1 and a resistance element R2 connected in series between a power supply potential VDD and a ground potential VSS. One end of the resistance element R1 is connected to a power supply line through which the power supply potential VDD is supplied, and the other end thereof is connected to a node NdH. One end of the resistance element R2 is connected to the node NdH, and the other end thereof is connected to a ground line through which the ground potential VSS is supplied.

For example, a potential (reference potential) of the node NdH can be set to a potential of the power supply potential VDD×0.5 by causing resistance values of the resistance element R1 and the resistance element R2 to be identical. The reference potential generation circuit includes the voltage dividing circuit using the resistance elements in this embodiment, but may include a circuit which generates a potential in which power supply potential dependence is small by using a band gap circuit or the like.

The comparison circuit 14 has a non-inverting input terminal connected to the node NdR of the replica 12 and an inverting input terminal connected to the node NdH of the reference potential generation circuit 13, and outputs a threshold adjustment signal CTRL from the output terminal thereof. The comparison circuit 14 adjusts gate potentials of the P-channel type MOS transistor P3 and the N-channel type MOS transistor N3 of the replica 12 by the threshold adjustment signal CTRL, so that the potential of the node NdR of the replica 12 is the same as the reference potential (the potential of the node NdH).

That is, the comparison circuit 14 causes the logic threshold voltage of the replica 12 to be the same as the reference potential even in the case where the P-channel type MOS transistor and the N-channel type MOS transistor have different driving ability characteristics by a fabrication process variation. Also, the comparison circuit 14 causes the logic threshold voltage of the input CMOS circuit 11, which has the same circuit configuration as the replica 12 except that the input and the output are connected, to be the same as the reference potential (the potential of the node NdH), by adjusting gate potentials of the P-channel type MOS transistor P2 and the N-channel type MOS transistor N2 of the input CMOS circuit 11 by the threshold adjustment signal CTRL.

Figure 2A:
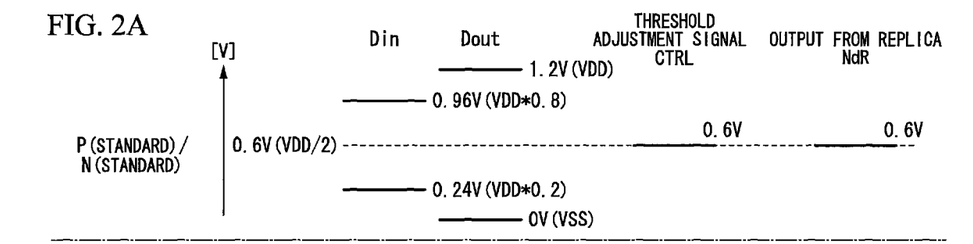
FIGS. 2A, 2B and 2C are diagrams illustrating operations of the semiconductor device of FIG. 1.
Figure 2B:
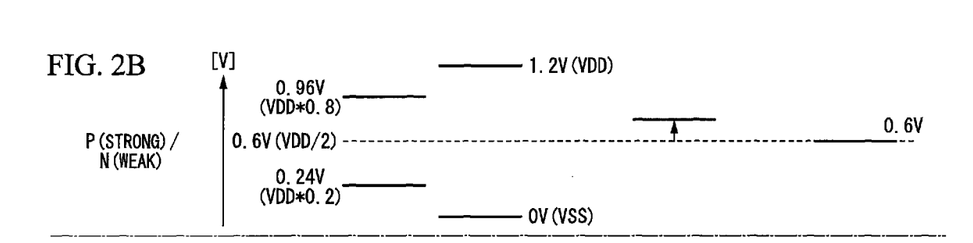
Figure 2C:
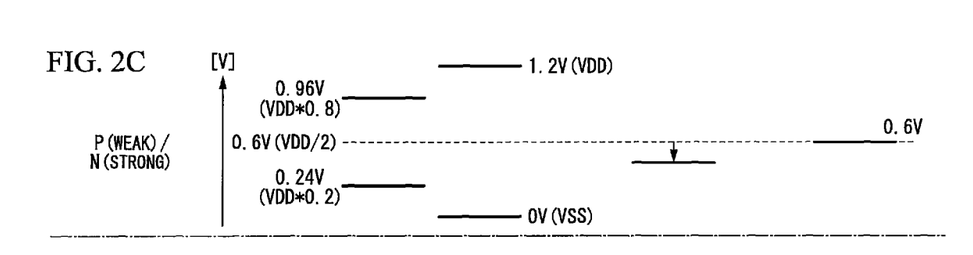

FIGS. 2A to 2C are band diagrams showing the potentials of the input terminal Din and the output terminal Dout of the semiconductor device 100 having the above configuration, the potential of the threshold adjustment signal CTRL, and the potential of the node NdR of the replica 12.

FIGS. 2A to 2C show potentials in the case where the power supply potential VDD is 1.2 V, the high potential VIH of the input signal input to the input terminal Din is 0.96 V, which is 0.8 times the power supply potential, and the low potential VIL thereof is 0.24 V, which is 0.2 times the power supply potential. The resistance element R1 and the resistance element R2 constituting the reference potential generation circuit 13 have the same resistance value, and the potential of the node NdH (the reference potential) is set to 0.6 V.

In FIGS. 2A to 2C, P (standard)/N (standard) is shown in FIG. 2A when the driving ability of the P-channel type MOS transistor and the driving ability of the N-channel type MOS transistor are made as in the circuit design, P (strong)/N (weak) is shown in FIG. 2B when the driving ability of the P-channel type MOS transistor is higher than that of the N-channel type MOS transistor after fabrication, and P (weak)/N (strong) is shown in FIG. 2C when the driving ability of the P-channel type MOS transistor is lower than that of the N-channel type MOS transistor after fabrication.

The semiconductor device 100 decides circuit constants of each transistor to be configured so that the logic threshold voltage of the input CMOS circuit 11 becomes a center value of the operating potential VDD in the design. At this time, the potential of the threshold adjustment signal CTRL becomes 0.6 V which is the same as the reference potential 0.6 V as shown in FIG. 2A.

On the other hand, in the case of P (strong)/N (weak) shown in FIG. 2B, the logic threshold voltages of the input CMOS circuit 11 and the replica 12 are higher than 0.6 V. However, the comparison circuit 14 sets the potential of the threshold adjustment signal CTRL to be higher than 0.6 V, so that the potential of the node NdR is set to 0.6 V, which is the same as the reference potential, by lowering the driving ability of the P-channel type MOS transistor P3 of the replica 12 and raising the driving ability of the N-channel type MOS transistor N3 thereof. Also, the comparison circuit 14 sets the logic threshold voltage of the input CMOS circuit 11 to 0.6 V, which is the same as the reference potential, by lowering the driving ability of the P-channel type MOS transistor P2 and raising the driving ability of the N-channel type MOS transistor N2 of the input CMOS circuit 11, which has the same circuit configuration as the replica 12 except that the input and the output are connected.

On the other hand, in the case of P (weak)/N (strong) shown in FIG. 2C, the logic threshold voltages of the input CMOS circuit 11 and the replica 12 are lower than 0.6 V. However, the comparison circuit 14 sets the potential of the threshold adjustment signal CTRL to a potential of less than 0.6 V, so that the potential of the node NdR is set to 0.6 V, which is the same as the reference potential, by raising the driving ability of the P-channel type MOS transistor P3 of the replica 12 and lowering the driving ability of the N-channel type MOS transistor N3 thereof. Also, by the threshold adjustment signal CTRL, the comparison circuit 14 sets the logic threshold voltage of the input CMOS circuit 11 to 0.6 V, which is the same as the reference potential, by raising the driving ability of the P-channel type MOS transistor P2 and lowering the driving ability of the N-channel type MOS transistor N2 of the input CMOS circuit 11, which has the same circuit configuration as the replica 12 except that the input and the output are connected.

Even when the driving ability of the P-channel type MOS transistor and the driving ability of the N-channel type MOS transistor are shifted from the design after fabrication, in the semiconductor device 100 of this embodiment, the logic threshold voltages of the input CMOS circuit 11 and the replica 12 are adjusted by the same threshold adjustment signal CTRL, so that the logic threshold voltages can be set to 0.6 V, which is the same as the reference potential.

As described above, the semiconductor device of this embodiment is a semiconductor device (the semiconductor device 100) characterized by including an input buffer (the input CMOS circuit 11) capable of adjusting a logic threshold voltage, a replica (the replica 12) which is a buffer having the same configuration as the input buffer and in which an input and an output are connected, a reference potential generation circuit (the reference potential generation circuit 13) which generates a preset reference potential, a comparison circuit (the comparison circuit 14) which compares an output potential (the potential of the node NdR) of the replica with a reference potential (the potential of the node NdH) and outputs a threshold adjustment signal (the threshold adjustment signal CTRL) for adjusting the logic threshold voltage of the input buffer to the input buffer and the replica.

According to the present embodiment, since the logic threshold voltage of the replica (the replica 12) is adjusted on the basis of the threshold adjustment signal as in the input buffer (the input CMOS circuit 11) and the input and the output are connected (short-circuited) in the replica (the replica 12), the potentials of the output and input of the replica (the potential of the node NdR) are the same as the logic threshold voltage of the input buffer (the input CMOS circuit 11). Since the comparison circuit (the comparison circuit 14) compares the preset reference potential (the potential of the node NdH) with the logic threshold voltage of the replica (the potential of the node NdR), generates the logic threshold adjustment signal (the threshold adjustment signal CTRL), and adjusts the logic threshold voltages of the input buffer (the input CMOS circuit 11) and the replica (the replica 12), the logic threshold voltages of the input buffer (the input CMOS circuit 11) and the replica (the replica 12) can be set to be the same as the reference potential (the potential of the node NdH). Thereby, even when there is a characteristic change such as a characteristic change made by a process variation or the like in the input buffer (the input CMOS circuit 11), the logic threshold voltage of the input buffer (the input CMOS circuit 11) is the same as the reference potential (the potential of the node NdH), so that a semiconductor device capable of accurately sensing an H or L level of the input signal can be provided.

According to the present embodiment, since the logic threshold voltage is adjusted without requiring a signal of a clock or the like from the outside, a semiconductor device capable of accurately sensing the H or L level of the input signal can be provided even when a frequency of an external CLK is changed according to a use situation.

Second Embodiment

A second embodiment of the present invention will be described.

Figure 3:
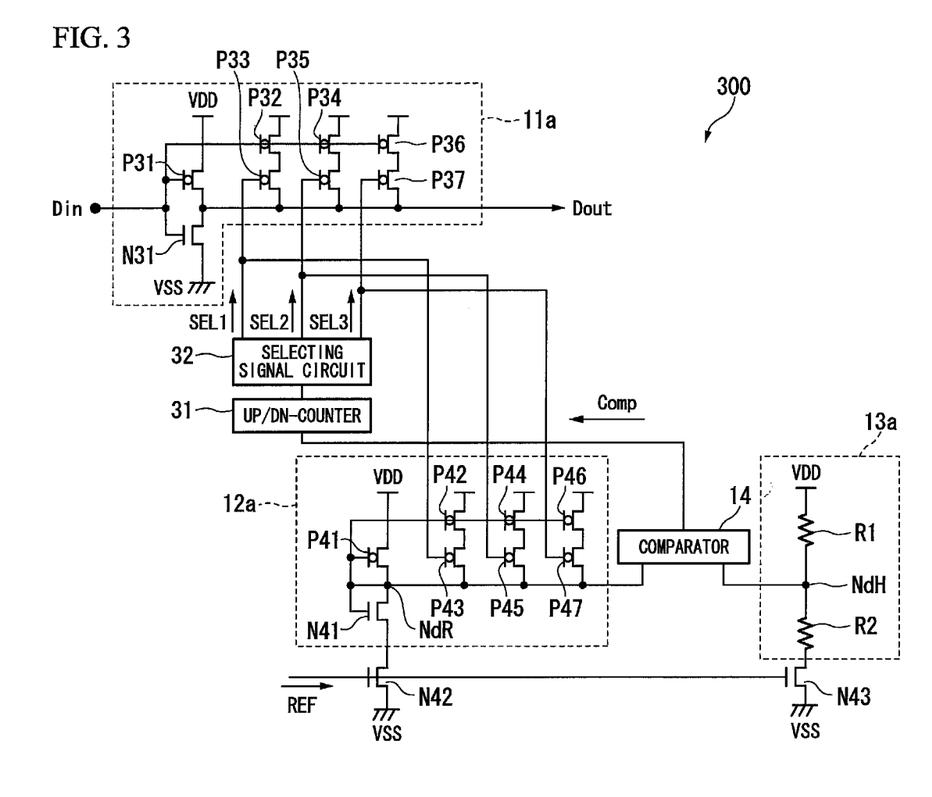
FIG. 3 is a circuit diagram illustrating another circuit configuration of a semiconductor device in accordance with a second embodiment of the present invention.

FIG. 3 is a configuration diagram of a semiconductor device 300 according to another embodiment of the present invention. Elements of FIG. 3 which are the same as those of FIG. 1 are denoted by the same reference numerals, and descriptions thereof are omitted. Differences between the semiconductor device 300 of FIG. 3 and the semiconductor device 100 of FIG. 1 are as follows.

In FIG. 3, an input CMOS circuit 11a includes P-channel type MOS transistors P31 to P37 and an N-channel type MOS transistor N31 connected between a power supply potential VDD and a ground potential VSS which form a current path. The P-channel type MOS transistor P32 and the P-channel type MOS transistor P33, the P-channel type MOS transistor P34 and the P-channel type MOS transistor P35, and the P-channel type MOS transistor P36 and the P-channel type MOS transistor P37 respectively form serial circuits, which are connected between the power supply potential and the output terminal and are connected in parallel with the P-channel type MOS transistor P31.

A replica 12a includes P-channel type MOS transistors P41 to P47 and an N-channel type MOS transistor N41 connected between a power supply potential VDD and a ground potential VSS which form a current path. The P-channel type MOS transistors P41 to P47 and the N-channel type MOS transistor N41 constituting the replica 12a correspond to the P-channel type MOS transistors P31 to P37 and the N-channel type MOS transistor N31 constituting the input CMOS circuit 11a, respectively. Gate terminals of the P-channel type MOS transistor P41 and the N-channel type MOS transistor N41 of the replica 12a are connected (short-circuited) to a node NdR.

In the semiconductor device 300 of this embodiment, the replica 12a is connected to an N-channel type MOS transistor N42 having a gate terminal to which a control signal REF is input, and is connected between the power supply potential VDD and the ground potential VSS which form the current path. For example, when the semiconductor device 300 is a DRAM, the control signal REF is a signal having an H level in a fixed period in which a logic threshold is adjusted in a periodic operation like a refresh operation.

A channel width of a transistor constant of the N-channel type MOS transistor N42 is set to be larger than that of the N-channel type MOS transistor N41. This is to lower ON resistance of the N-channel type MOS transistor N42 so that the logic threshold voltage of the replica 12a is not lowered. The control signal REF has an L level out of the logic threshold adjustment period, so that the N-channel type MOS transistor N42 interrupts the current path of the replica 12a and thus current consumption of the replica 12a is reduced.

A reference potential generation circuit 13a includes a resistance element R1 and a resistance element R2 connected in series between a power supply potential VDD and a ground potential VSS, and is connected to an N-channel type MOS transistor N43 having a gate terminal to which the control signal REF is input, and connected between the power supply potential VDD and the ground potential VSS which form a current path. Also, a channel width of a transistor constant of the N-channel type MOS transistor N43 is set to be ON resistance, which is less than a sum of resistance values of the resistance element R1 and the resistance element R2, so that the reference potential is not lowered. In the N-channel type MOS transistor N43, like the N-channel type MOS transistor N42, the control signal REF has an L level out of the logic threshold adjustment period and thus current consumption of the reference potential generation circuit 13a is reduced.

In FIG. 3, the semiconductor device 300 has an Up/Down counter 31 (Up/Dn counter) and a selection signal circuit 32.

The Up/Dn counter 31 is connected to an output of a comparison circuit 14, receives a comparison signal Comp, and increments a count value of a built-in counter when the comparison signal Comp has an H level. When the comparison signal Comp has an L level, the Up/Dn counter 31 decrements the count value of the built-in counter. The comparison signal Comp is a signal corresponding to the threshold adjustment signal CTRL in the first embodiment, and has the H level if the logic threshold voltage of the replica 12a is higher than the reference potential, and has the L level if the logic threshold voltage of the replica 12a is lower than the reference potential. Thus, the Up/Dn counter 31 has a built-in comparator for a comparison with the reference potential, and increments/decrements the built-in counter according to the comparison with the reference potential.

The selection signal circuit 32 is connected to the Up/Dn counter 31, and generates selection signals SEL1 to SEL3 on the basis of the count value of the built-in counter of the Up/Dn counter 31. The selection signals SEL1 (LSB) to SEL3 (MSB) are a 3-bit logic signal sequentially forming the least significant bit to the most significant bit. Hereinafter, the least significant bit to the most significant bit are denoted by (SEL1, SEL2, SEL3)=(L, L, L) to (H, H, H). The selection signal circuit 32 generates (SEL1, SEL2, SEL3), and controls the P-channel type MOS transistors P33, P35, and P37 of the input CMOS circuit 11a and the P-channel type MOS transistors P43, P45, and P47 of the replica 12a to be conductive/non-conductive.

For example, when (L, L, L) is generated, the logic threshold voltage of each circuit is set to the highest potential by causing the P-channel type MOS transistors P33, P35, and P37 of the input CMOS circuit 11a and the P-channel type MOS transistors P43, P45, and P47 of the replica 12a to be conductive. When the selection signal circuit 32 generates (H, H, H), the logic threshold voltage of each circuit is set to the lowest potential by causing the P-channel type MOS transistors P33, P35, and P37 of the input CMOS circuit 11a and the P-channel type MOS transistors P43, P45, and P47 of the replica 12a to be non-conductive.

When the logic threshold adjustment period expires (when the control signal REF has the L level), the selection signal circuit 32 latches the logic levels of the selection signals SEL1 to SEL3 until the next logic threshold voltage adjustment is reached, and fixes the logic threshold voltages of the input CMOS circuit 11a and the replica 12a.

Figure 4A:
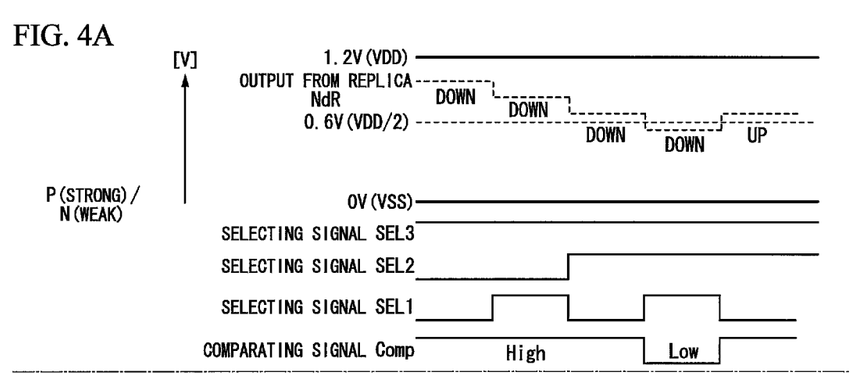
FIGS. 4A and 4B are diagrams illustrating operations of the semiconductor device of FIG. 3.
Figure 4B:
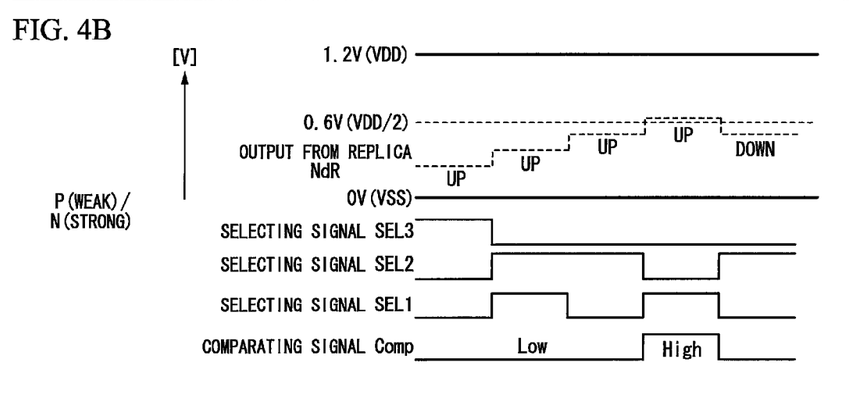

FIGS. 4A and 4B are band diagrams showing a potential change of the node NdR of the replica 12a of the semiconductor device 300 having the above configuration, logic levels (H/L levels) of the selection signals SEL1 to SEL3, and logic levels (H/L levels) of the comparison signal Comp.

Like FIGS. 2A to 2C, FIGS. 4A and 4B show potentials when the power supply potential VDD is 1.2 V. Although not shown in FIGS. 4A and 4B, resistance values of the resistance element R1 and the resistance element R2 constituting the reference potential generation circuit 13a are identical, and the potential of the node NdH (the reference potential) is set to 0.6 V as in the first embodiment.

In FIGS. 4A and 4B, P (strong)/N (weak) is shown in FIG. 4A when the driving ability of the P-channel type MOS transistor is higher than that of the N-channel type MOS transistor after fabrication, and P (weak)/N (strong) is shown in FIG. 4B when the driving ability of the P-channel type MOS transistor is lower than that of the N-channel type MOS transistor after fabrication.

The semiconductor device 300 decides circuit constants of each transistor to be configured so that the logic threshold voltage of the input CMOS circuit 11 becomes a center value of the operating potential VDD in the design. At this time, the logic threshold voltage may ideally become 0.6 V as indicated by a dashed line in FIGS. 4A and 4B.

However, in the case of P (strong)/N (weak) shown in FIG. 4A, the logic threshold voltages of the input CMOS circuit 11*a* and the replica 12*a* become higher than 0.6 V. However, the comparison circuit 14 causes the potential of the comparison signal Comp to be a potential (High) of more than 0.6 V.

Since the potential of the comparison signal Comp is a potential (High) of more than 0.6 V, the Up/Dn counter 31 starts a count operation and continues an increment operation until the logic threshold voltages of the input CMOS circuit 11*a* and the replica 12*a* are lower than 0.6 V, that is, until the comparison signal Comp has the L level.

In this period, the selection signal circuit 32 sequentially sets the logic levels of the selection signals SEL1 to SEL3 to (L, L, H), (H, L, H), (L, H, H), and (H, H, H) on the basis of the increment of the count value, and lowers the logic threshold voltages of the input CMOS circuit 11*a* and the replica 12*a*.

When the logic threshold voltage of the replica 12*a* is lower than 0.6 V, the comparison circuit 14 sets the potential of the comparison signal Comp to a potential (Low) of less than 0.6 V. Thereby, since the comparison signal Comp has the L level, the Up/Dn counter 31 performs a decrement operation once and terminates the count operation. The selection signal circuit 32 sets the logic levels of the selection signals SEL1 to SEL3 to (H, L, H) on the basis of the decremented count value, raises the logic threshold voltages of the input CMOS circuit 11*a* and the replica 12*a*, and completes the logic threshold voltage adjustment. Thereby, the logic threshold voltages of the two circuits become 0.6 V which is substantially the same as the reference potential.

On the other hand, in the case of P (weak)/N (strong) shown in FIG. 4B, the logic threshold voltages of the input CMOS circuit 11*a* and the replica 12*a* become lower than 0.6 V. However, the comparison circuit 14 sets the potential of the comparison signal Comp to a potential (Low) of less than 0.6 V.

The Up/Dn counter 31 starts a count operation and continues a decrement operation until the logic threshold voltages of the input CMOS circuit 11*a* and the replica 12*a* are higher than 0.6 V, that is, until the comparison signal Comp has the H level.

In this period, the selection signal circuit 32 sequentially sets the logic levels of the selection signals SEL1 to SEL3 to (L, L, H), (H, H, L), (L, H, L), and (H, L, L) on the basis of the decrement of the count value, and raises the logic threshold voltages of the input CMOS circuit 11*a* and the replica 12*a*.

When the logic threshold voltage of the replica 12*a* is higher than 0.6 V, the comparison circuit 14 sets the potential of the comparison signal Comp to a potential (High) of more than 0.6 V. Thereby, since the comparison signal Comp has the H level, the Up/Dn counter 31 performs the increment operation once and terminates the count operation. The selection signal circuit 32 sets the logic levels of the selection signals SEL1 to SEL3 to (L, H, L) on the basis of the incremented count value, lowers the logic threshold voltages of the input CMOS circuit 11*a* and the replica 12*a*, and completes the logic threshold voltage adjustment. Thereby, the logic threshold voltages of the two circuits become 0.6 V which is substantially the same as the reference potential.

As described above, the semiconductor device according to this embodiment is a semiconductor device (the semiconductor device 300) characterized by including an input buffer (the input CMOS circuit 11*a*) having a logic inverting circuit (a logic inverting circuit having the P-channel type MOS transistors P31, P32, P34, and P36 and the N-channel type MOS transistor N31) to which an input signal is input from the outside and first logic threshold voltage control transistors which are inserted into a current path from a power supply potential to a ground potential along with the logic inverting circuit and are controlled to be conductive on the basis of a threshold adjustment signal (the comparison signal Comp), a replica (the replica 12*a*) having a sub-replica (a circuit having the P-channel type MOS transistors P41, P42, P44, and P46 and the N-channel type MOS transistor N41) in which an input and an output are connected in the same configuration as that of the logic inverting circuit, and second logic threshold voltage control transistors which are inserted into a current path from a power supply potential to a ground potential along with the sub-replica and are controlled to be conductive on the basis of the threshold adjustment signal (the comparison signal Comp), and having the same circuit constants as the input buffer or circuit constants of predetermined multiples thereof, a reference potential generation circuit (the reference potential generation circuit 13*a*) for generating a preset reference potential, and a comparison circuit (the comparison circuit 14) for comparing the reference potential with the logic threshold voltage which is an output potential of the replica, and outputting the threshold adjustment signal to gates of the first logic threshold voltage control transistors of the input buffer and gates of the second logic threshold voltage control transistors of the replica.

The first logic threshold voltage control transistors are a plurality of transistors (the P-channel type MOS transistors P33, P35, and P37) which are connected in parallel with the current path of the input buffer (the input CMOS circuit 11*a*) and are respectively controlled to be conductive by selection signals (the selection signals SEL1 to SEL3), and the second logic threshold voltage control transistors are a plurality of transistors (the P-channel type MOS transistors P43, P45, and P47) which are connected in parallel with the current path of the replica (the replica 12*a*) and are respectively controlled to be conductive by the selection signals. There are further provided an up/down counter (the Up/Dn counter 31) for performing a potential comparison between the threshold adjustment signal and the reference potential and incrementing/decrementing a count value according to the comparison result, and a selection signal circuit (the selection signal circuit 32) for generating the selection signals on the basis of the count value and retaining logic levels of the selection signals.

According to the present embodiment, for example, a current periodically flows through the current path of the replica (the replica 12*a*) in the case of a refresh operation of the DRAM, and adjustment results (the logic levels of the selection signals SEL1 to SEL3) are fed back to the logic threshold voltage of the input buffer (the input CMOS circuit 11*a*) by a comparison between the reference potential (the potential of the node NdH) and the logic threshold voltage (the potential of the node NdR) of the replica. The input buffer (the input CMOS circuit 11*a*) can be operated at a proper logic threshold voltage in an operation subsequent to the refresh operation by latching digital signals (the selection signals SEL1 to SEL3) as the adjustment results.

Since a ratio of driving abilities of the P-channel type MOS transistor and the N-channel type MOS transistor changing independently of each other can be adjusted, it is possible to follow the logic threshold voltage of the input buffer even in a temperature change.

It is possible to turn off the current consumption of the replica 12a and the reference potential generation circuit 13a, and it is possible to reduce current consumption of a semiconductor device out of a logic threshold voltage adjustment period.

Third Embodiment

A third embodiment of the present invention will be described. The third embodiment is an embodiment for responding to a current in the first embodiment.

Figure 5:
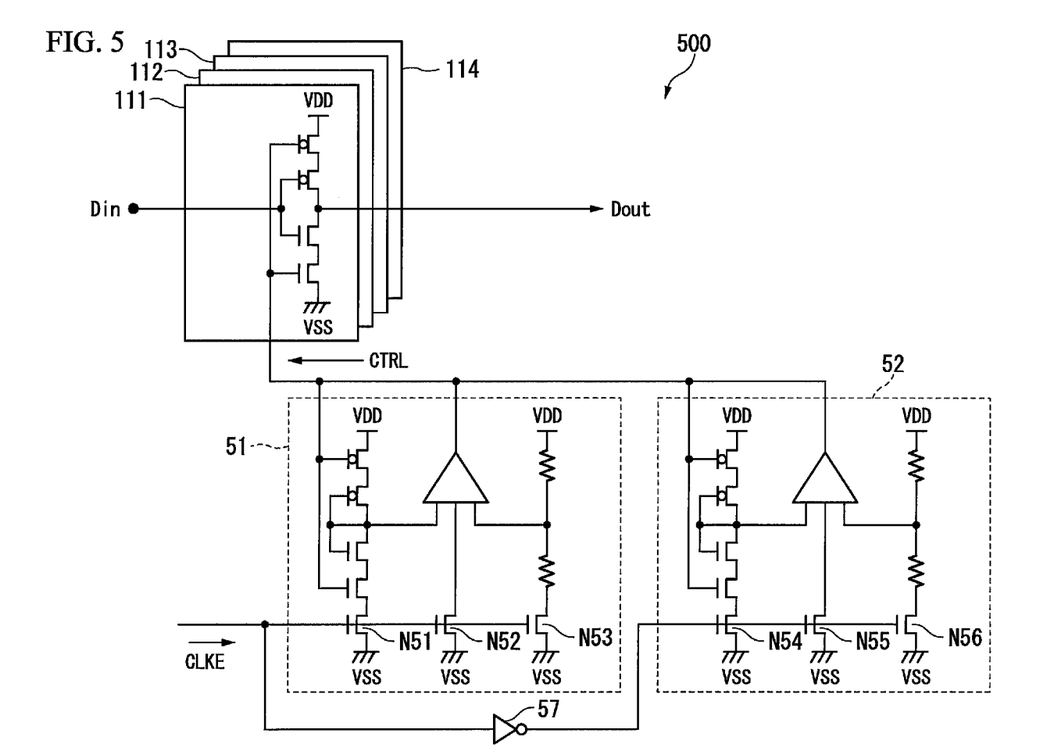
FIG. 5 is a circuit diagram illustrating still another circuit configuration of a semiconductor device in accordance with a third embodiment of the present invention.

FIG. 5 is a configuration diagram of a semiconductor device 500 according to still another embodiment of the present invention. Elements of FIG. 5 which are the same as those of FIG. 1 are denoted by the same reference numerals, and descriptions thereof are omitted.

Differences between the semiconductor device 500 of FIG. 5 and the semiconductor device 100 of FIG. 1 are as follows.

In FIG. 5, 4 input CMOS circuits 111 to 114 having the same configuration as the input CMOS circuit 11 of FIG. 1 are formed. Of course, the number of elements is not limited to 4 as shown in the figure, and may be plural. These input CMOS circuits respectively have input and output terminals, and receive a common logic threshold adjustment signal CTRL from a comparison circuit 14.

In the replica 12, the reference potential generation circuit 13, and the comparison circuit 14 shown in FIG. 1, an N-channel type MOS transistor N51, an N-channel type MOS transistor N52, and an N-channel type MOS transistor N53 are respectively inserted between power supply potentials and ground potentials. A control signal CLKE is input to a gate terminal of each N-channel type MOS transistor. Such a circuit including the N-channel type MOS transistors N51 to N53 is designated as a first adjustment signal generation circuit 51.

In the replica 12, the reference potential generation circuit 13, and the comparison circuit 14 shown in FIG. 1, an N-channel type MOS transistor N54, an N-channel type MOS transistor N55, and an N-channel type MOS transistor N56 are respectively inserted between power supply potentials and ground potentials. A signal to which the control signal CLKE is logically inverted by an inverter 57 is input to a gate terminal of each N-channel type MOS transistor. Such a circuit including the N-channel type MOS transistors N54 to N56 is designated as a second adjustment signal generation circuit 52.

For example, when the semiconductor device 500 is a DRAM, the control signal CLKE is a signal to be input to a CKE terminal or a signal in phase with CKE, and is a signal for switching the semiconductor device to a standby mode or a power-down mode if a change is made from an H level to an L level or switching the semiconductor device to a normal operation mode if a change is made from an L level to an H level. Accordingly, in the standby mode, the first adjustment signal generation circuit 51 is deactivated and the second adjustment signal generation circuit 52 is activated. On the other hand, when switching to the normal operation mode is performed, the first adjustment signal generation circuit 51 is activated and the second adjustment signal generation circuit 52 is deactivated.

Here, the comparison circuit 14 drives a plurality of input CMOS circuits 111 to 114. The comparison circuit 14 should set circuit constants to be large since it is necessary to increase the responsiveness to changes in output potentials of the replica 12 and the reference potential generation circuit 13 so as to adjust the logic threshold voltage at a high speed in the normal operation. The replica 12 should increase the responsiveness to a change in output potential of the comparison circuit 14 and the reference potential generation circuit 13 should increase the responsiveness to a change in power supply potential. Thus, it is necessary to set the size of a transistor constituting the first adjustment signal generation circuit 51 to be large and to set a resistance value to be small. Accordingly, current consumption is increased in the normal operation.

To reduce current consumption in the standby mode, the threshold adjustment signal generation circuit (second adjustment signal generation circuit) for the standby mode compared to the threshold adjustment signal generation circuit (first adjustment signal generation circuit) for the normal operation mode is configured to suppress a current by setting the ability of the comparison circuit to half or less, setting the size of the input circuit of the replica to half or less, and setting the resistance of the reference potential generation circuit to double or more than double that for the normal operation. Thereby, it is possible to reduce current consumption in the semiconductor device 500 of this embodiment.

Fourth Embodiment

A fourth embodiment of the present invention will be described. A difference between the fourth embodiment and the first embodiment is that the resistance of a reference potential generation circuit can be adjusted.

Figure 6:
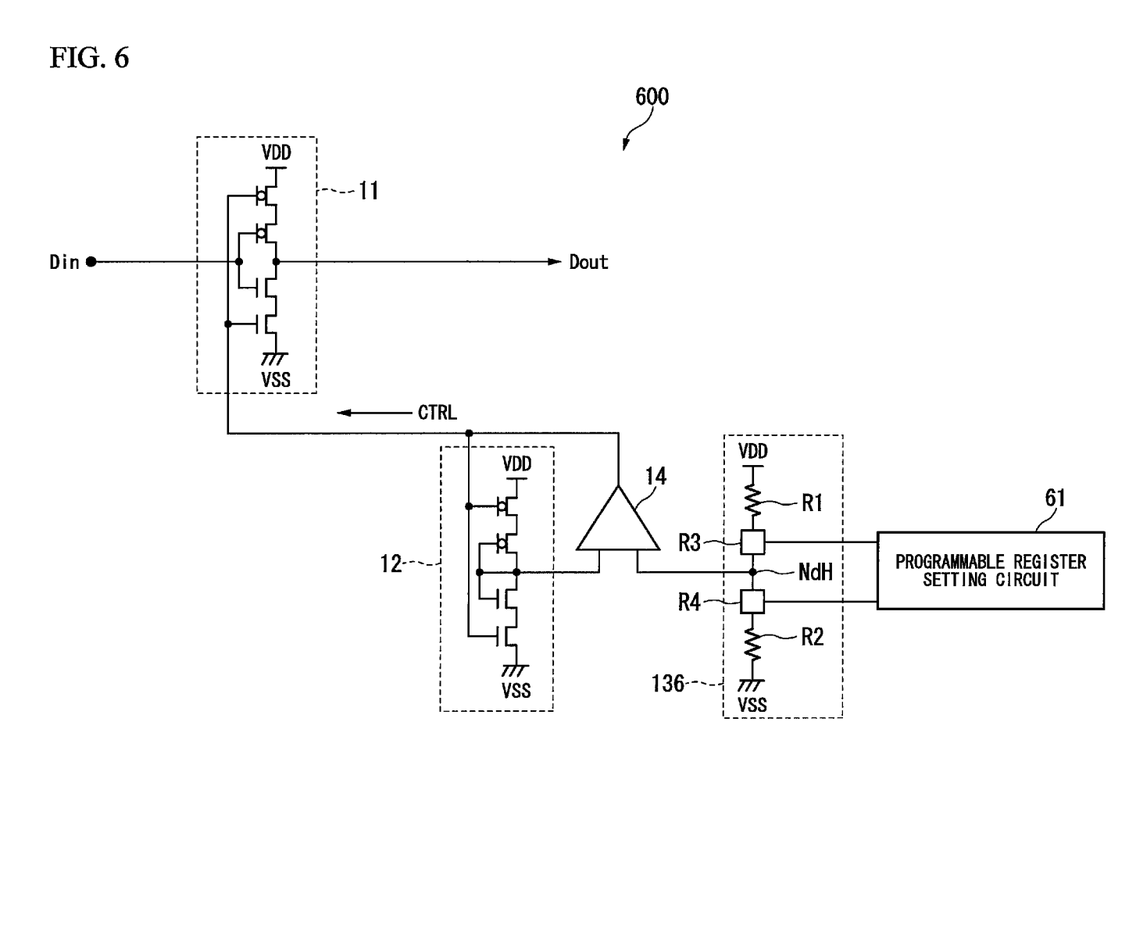
FIG. 6 is a circuit diagram illustrating still another circuit configuration of a semiconductor device in accordance with a fourth embodiment of the present invention.

FIG. 6 is a configuration diagram of a semiconductor device 600 according to yet another embodiment of the present invention. Elements of FIG. 6 which are the same as those of FIG. 1 are denoted by the same reference numerals, and descriptions thereof are omitted.

A difference between the semiconductor device 600 of FIG. 6 and the semiconductor device 100 of FIG. 1 is as follows.

In FIG. 6, a reference potential generation circuit 136 further includes a programmable adjustment resistance element R3 inserted between the resistance element R1 and the node NdH of the reference potential generation circuit 13 of FIG. 1 and a programmable adjustment resistance element R4 inserted between the resistance element R2 and the node NdH. The programmable adjustment resistance elements R3 and R4 are connected to a programmable register setting circuit 61 in which external data is writable, and a resistance value is variable via the setting circuit.

For example, the programmable adjustment resistance element R3 can variably adjust the resistance by connecting a plurality of serial circuits connected in parallel between the resistance element R1 and the node NdH, wherein each serial circuit has a transistor and a resistance element connected in series, and by adjusting a gate potential of the transistor by the programmable register setting circuit 61.

In a test operation, the programmable register setting circuit 61 controls ON/OFF of the transistor connected in series with the resistance element on the basis of data input from the outside, sets an optimal reference potential, and stores its information (information indicating which transistor is turned on or off) in a built-in register including, for example, a non-volatile element (a fuse element or the like). After the optimal reference potential is set, the comparison circuit compares the reference potential with the logic threshold voltage and the logic threshold voltages of the input buffer and the replica are adjusted.

That is, a potential (the potential of the node NdR) at which the input and the output of the replica 12 are short-circuited becomes the logic threshold voltage of the input CMOS circuit 11, but the characteristics of the logic threshold voltage are shifted by imbalance due to an actual layout arrangement of the semiconductor device and a layout of a comparison circuit (differential AMP). As described above, some resistance elements of the reference potential generation circuit 13 of FIG. 1 serve as programmable resistance elements. Thereby, the test (VIH/VIL test) of the logic threshold voltage measurement is performed, and the reference potential is corrected, while the logic threshold voltage is adjusted to be the same as the reference potential by changing a programmable resistance value by data from the outside in a test operation of a wafer state of the semiconductor device 600.

On the basis of the test result (reference potential correction result), resistance value data (transistor ON/OFF information in the above example) of a programmable adjustment resistance element is stored in the built-in register of the programmable register setting circuit 61. After the logic threshold voltage is adjusted, the logic threshold voltage of the input CMOS circuit 11 is the same as the reference potential after correction. In the third embodiment, this configuration may be particularly effective in the case where an adjustment result of the logic threshold voltage differs according to a different reference potential between the first adjustment signal generation circuit and the second adjustment signal generation circuit using a current limit transistor.

Fifth Embodiment

A fifth embodiment of the present invention will be described.

Figure 7:
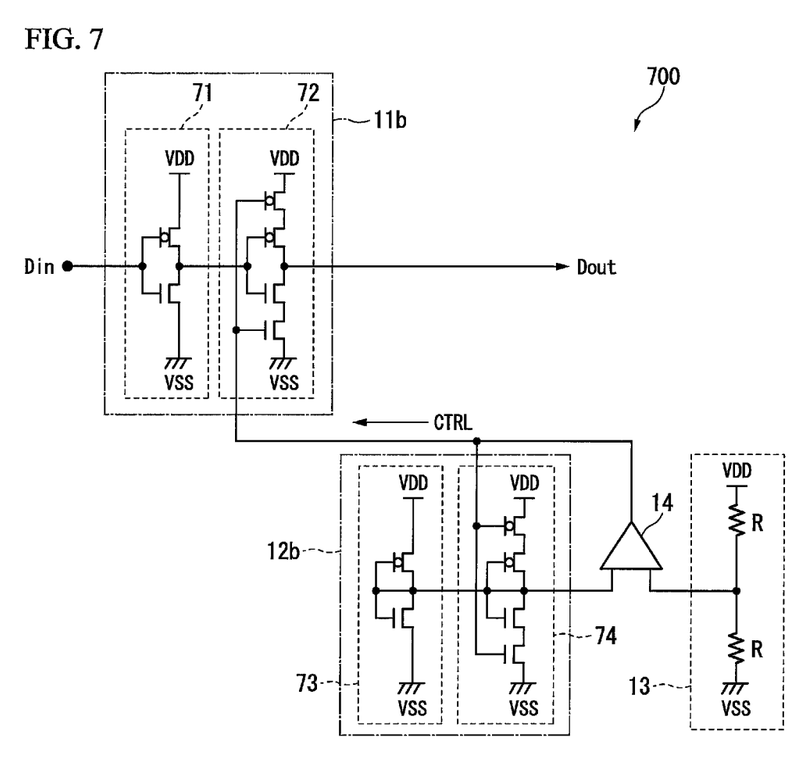
FIG. 7 is a circuit diagram illustrating still another circuit configuration of a semiconductor device in accordance with a fifth embodiment of the present invention.

FIG. 7 is a configuration diagram of a semiconductor device 700 according to yet another embodiment of the present invention. Elements of FIG. 7 which are the same as those of FIG. 1 are denoted by the same reference numerals, and descriptions thereof are omitted.

A difference between the semiconductor device 700 of FIG. 7 and the semiconductor device 100 of FIG. 1 is that an input CMOS circuit includes two stage inverters and a logic threshold voltage is adjusted in a second-stage inverter.

In FIG. 7, an input CMOS circuit 11b includes an inverter 71 and an inverter 72. A replica 12b is installed in correspondence with the input CMOS circuit 11b. The replica 12b is configured by connecting a first replica 73 in which an output and an input are connected with a second replica 74 in which an output and an input are connected in series. The first replica 73 and the second replica 74 are respectively designed to have the same circuit constants as the inverter 71 and the inverter 72 or to have circuit constants which are a predetermined ratio times the circuit constants of the inverter 71 and the inverter 72. The remaining configuration is the same as that of FIG. 1. The logic threshold voltage of the semiconductor device 700 is adjusted by the second-stage inverter 72, and the adjustment method is identical to that of the first embodiment designed using FIGS. 1, and 2A to 2C.

By this configuration, it is possible to suppress an increase in input capacity of an input initial stage (the inverter 71). That is, since the input initial stage unit has a vertically stacked structure in the case of FIG. 1, it is necessary to increase sizes of all transistors constituting the input CMOS circuit 11 so as to prevent the speed upon conversion of an input signal from being slow. Thus, the capacity of an input terminal is increased by the capacity of a gate of a transistor to which the input terminal is connected. On the other hand, since an element for adjusting the logic threshold voltage is configured in the second stage as in this embodiment, the capacity of the input terminal can be reduced without having to increase the size of the initial stage. Even in CMOS logic circuits of the second to fourth embodiments, an element for adjusting the logic threshold voltage of an inverter circuit after the second stage may be configured as in this configuration.

Embodiments have been described above, but basic technical ideas of the present embodiment can be applied to a semiconductor device having an input buffer such as, for example, a memory, logic, CPU, MCU, or DSP device. The present embodiment may also be applied to a semiconductor device of SIP or package-on-package (POP). It is preferable that a transistor be a field effect transistor (FET). The present embodiment may be applied to various FETs of a metal-insulator semiconductor (MIS), a thin film transistor (TFT), and the like as well as a metal oxide semiconductor (MOS). A transistor (for example, a bipolar type transistor) as well as the FET may be used in some elements of the present embodiment. An NMOS transistor (N-channel type MOS transistor) is a representative example of a first conductivity type transistor, and a PMOS transistor (P-channel type MOS transistor) is a representative example of a second conductivity type transistor.

An example in which a logic threshold voltage is a potential of ½ the power supply potential has been described in the embodiment, but the logic threshold voltage may be adjusted to a potential other than the potential of ½ the power supply potential by changing a reference potential.

The term "configured" is used to describe a component, section or part of a device includes hardware and/or software that is constructed and/or programmed to carry out the desired function.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device, comprising:
    an input buffer comprising:
        first and second PMOS transistors serially interconnected between a first power supply node and an output node of the input buffer; and
        first and second NMOS transistors serially interconnected between a second power supply node and the output node of the input buffer,
        wherein a gate of the first PMOS transistor and a gate of the first NMOS transistor are connected to an input node of the input buffer, and a gate of the second PMOS transistor is connected to a gate of the second NMOS transistor;
    a replica circuit comprising:
        third and fourth PMOS transistors serially interconnected between the first power supply node and an output node of the replica circuit; and
        third and fourth NMOS transistors serially interconnected between the second power supply node and the output node of the replica circuit,
        wherein a gate of the third PMOS transistor is connected to a gate of the third NMOS transistor, a gate of the fourth PMOS transistor and a gate of the fourth NMOS transistor are connected to an input node of the replica circuit, and the input node of the replica circuit is connected to the output node of the replica circuit; and
    a comparison circuit that compares a voltage at the output node of the replica circuit to a reference voltage, an output voltage of the comparison circuit being connected to the gates of the second PMOS transistor and second NMOS transistor and to the gates of the third PMOS transistor and third NMOS transistor.

2. The semiconductor device as claimed in claim 1, wherein the reference voltage is set between a voltage of the first power supply node and a voltage of the second power supply node.

3. The semiconductor device as claimed in claim 2, wherein the reference voltage is adjustable by a programmable register.

4. The semiconductor device as claimed in claim 1, wherein a plurality of replica circuits including the replica circuit is connected to the input buffer.

5. The semiconductor device as claimed in claim 1, wherein a plurality of input buffers including the input buffer is connected to the replica circuit.

6. The semiconductor device as claimed in claim 1, further comprising a voltage generating circuit for providing the reference voltage.

7. The semiconductor device as claimed in claim 6, wherein the voltage generating circuit comprises a voltage dividing circuit.

8. The semiconductor device as claimed in claim 6, wherein the voltage dividing circuit comprises a first and second resistors serially interconnected between the first power supply node and the second power supply node and providing the reference voltage at a node interconnecting the first and second resisters.

9. The semiconductor device as claimed in claim 1, wherein the second PMOS transistor and the third PMOS transistor are directly connected to the first power supply and the second NMOS transistor and the third NMOS transistor are directly connected to the second power supply.

10. The semiconductor device as claimed in claim 1, wherein the second power supply is a ground potential.

11. The semiconductor device as claimed in claim 1, wherein the first power supply is VDD.

12. The semiconductor device as claimed in claim 1, wherein the semiconductor device is a central processing unit.

13. The semiconductor device as claimed in claim 1, wherein the semiconductor device is a dynamic random access memory.

* * * * *